(12) United States Patent
Hertz

(10) Patent No.: US 6,230,963 B1
(45) Date of Patent: *May 15, 2001

(54) METHOD AND APPARATUS USING COLORED FOILS FOR PLACING CONDUCTIVE PREFORMS

(76) Inventor: Eric L. Hertz, 12784 Tulipwood Cir., Boca Raton, FL (US) 33428

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/832,288

(22) Filed: Apr. 3, 1997

Related U.S. Application Data

(63) Continuation-in-part of application No. 08/789,883, filed on Jan. 28, 1997.

(51) Int. Cl.$^7$ ............................... B23K 3/00; B23K 31/02
(52) U.S. Cl. ............................................... 228/246; 228/41
(58) Field of Search .................. 228/41, 246; 29/842, 29/884, 747

(56) References Cited

U.S. PATENT DOCUMENTS

| | | |
|---|---|---|
| 4,209,893 | 7/1980 | Dyce et al. . |
| 4,216,350 | 8/1980 | Reid . |
| 4,437,232 | 3/1984 | Araki et al. . |
| 4,684,055 | 8/1987 | Baer et al. . |
| 4,712,721 | 12/1987 | Noel et al. . |
| 4,722,470 | 2/1988 | Johary . |
| 4,733,823 | 3/1988 | Waggener et al. . |
| 4,842,184 | 6/1989 | Miller, Jr. . |
| 4,871,110 * | 10/1989 | Fukasawa et al. ...................... 228/41 |
| 4,872,261 | 10/1989 | Sanyal et al. . |
| 4,898,320 | 2/1990 | Dunaway et al. . |
| 4,903,889 | 2/1990 | Svendsen et al. . |
| 4,906,832 | 3/1990 | Kushima et al. . |
| 4,997,674 * | 3/1991 | Parr et al. ............................ 427/123 |
| 5,029,748 | 7/1991 | Lauterbach et al. . |
| 5,048,747 | 9/1991 | Clark et al. . |
| 5,088,639 * | 2/1992 | Gondotra et al. ................. 228/180.1 |
| 5,107,759 | 4/1992 | Omori ................................. 101/114 |
| 5,108,024 | 4/1992 | Kazem-Goudarzi et al. . |
| 5,118,027 | 6/1992 | Braun et al. . |
| 5,118,584 | 6/1992 | Evans et al. . |
| 5,148,375 | 9/1992 | Horikami . |
| 5,159,535 | 10/1992 | Dasai et al. . |
| 5,172,853 | 12/1992 | Maiwald . |
| 5,205,896 * | 4/1993 | Brown et al. ........................ 156/297 |
| 5,211,328 | 5/1993 | Ameen et al. . |
| 5,219,117 | 6/1993 | Lin . |
| 5,220,200 | 6/1993 | Blanton . |
| 5,254,362 | 10/1993 | Shaffer et al. . |

(List continued on next page.)

FOREIGN PATENT DOCUMENTS

WO 9834749    8/1998  (WO) .

*Primary Examiner*—Patrick Ryan
*Assistant Examiner*—Jeffrey T. Knapp

(57) ABSTRACT

A method and apparatus are disclosed for placing solder balls on electronic pads on a component or substrate, such as for a ball grid array (BGA) applicator. The BGA applicator utilizes a foil(s) that is treated to provide color to the surface; the color is used to assist in inspection of the solder spheres. The solder balls can transferred to the electronic pads by holding them to openings in the foil by applying a holding force such as a vacuum applied to the solder balls through the openings in a foil. Optionally, a second material can be placed against the foil where the secondary material holds solder spheres to the apertures. After locating the solder balls to the electronic pads of a component or substrate, the solder balls are released and placed on the electronic pads by removing the holding force such as by deactivating the vacuum.

22 Claims, 9 Drawing Sheets

U.S. PATENT DOCUMENTS

| | | | |
|---|---|---|---|
| 5,255,839 | * 10/1993 | da Costa Alves et al. | 228/246 |
| 5,261,593 | 11/1993 | Casson et al. . | |
| 5,275,970 | 1/1994 | Itoh et al. . | |
| 5,284,287 | * 2/1994 | Wilson et al. | 228/180.2 |
| 5,289,631 | 3/1994 | Koopman et al. . | |
| 5,323,947 | 6/1994 | Juskey et al. . | |
| 5,356,658 | 10/1994 | Hertz et al. . | |
| 5,356,838 | 10/1994 | Kim . | |
| 5,363,277 | 11/1994 | Tamaka . | |
| 5,373,984 | 12/1994 | Wentworth . | |
| 5,388,327 | 2/1995 | Trabucco . | |
| 5,392,980 | 2/1995 | Swamy | 228/119 |
| 5,431,332 | 7/1995 | Kirby | 228/246 |
| 5,438,223 | 8/1995 | Higashi et al. . | |
| 5,445,313 | 8/1995 | Boyd et al. . | |
| 5,454,159 | 10/1995 | Norell . | |
| 5,467,913 | * 11/1995 | Namekawa et al. | 228/41 |
| 5,476,575 | * 12/1995 | Brophy et al. | 204/129.5 |
| 5,492,266 | 2/1996 | Hoebener et al. . | |
| 5,497,938 | 3/1996 | McMahon et al. . | |
| 5,499,487 | 3/1996 | McGill . | |
| 5,511,306 | 4/1996 | Denton et al. . | |
| 5,519,580 | 5/1996 | Natarajan et al. . | |
| 5,540,377 | 7/1996 | Ito | 228/41 |
| 5,542,601 | 8/1996 | Fallon | 228/119 |
| 5,547,530 | 8/1996 | Nakamura et al. . | |
| 5,551,216 | 9/1996 | McGill . | |
| 5,574,801 | 11/1996 | Collet-Beillon . | |
| 5,601,229 | * 2/1997 | Nakazato et al. | 228/246 |
| 5,607,099 | 3/1997 | Yeh et al. . | |
| 5,620,129 | 4/1997 | Rogren . | |
| 5,620,927 | * 4/1997 | Lee | 29/841 |
| 5,626,277 | 5/1997 | Kawada . | |
| 5,655,704 | 8/1997 | Sakemi et al. . | |
| 5,657,528 | 8/1997 | Sakemi et al. . | |
| 5,662,262 | 9/1997 | McMahon et al. . | |
| 5,680,984 | 10/1997 | Sakemi . | |
| 5,683,942 | 11/1997 | Kata et al. . | |
| 5,685,477 | * 11/1997 | Mallik et al. | 228/254 |
| 5,699,032 | * 12/1997 | Ulm, Jr. et al. | 337/297 |
| 5,704,536 | 1/1998 | Chen et al. . | |
| 5,749,614 | * 5/1998 | Reid et al. | 294/64.1 |
| 5,762,258 | * 6/1998 | Le Coz et al. | 228/56.3 |
| 5,765,744 | 6/1998 | Tatumi et al. . | |
| 5,839,641 | 11/1998 | Teng . | |
| 5,867,260 | * 2/1999 | Sakai | 356/237 |
| 5,918,792 | 7/1999 | Stumpe et al. . | |
| 5,921,458 | 7/1999 | Fan et al. . | |

\* cited by examiner

METHOD AND APPARATUS USING COLORED FOILS FOR PLACING CONDUCTIVE PREFORMS

This is a continuation-in-part of Ser. No. 08/789,883 filed Jan. 28, 1997.

FIELD OF THE INVENTION

This invention relates in general to the field of conductive preform placement systems for surface mount technology, and in particular to a method and apparatus for placing solder balls on electronic pads that are on a substrate such as for a ball grid array (BGA) applicator.

BACKGROUND OF THE INVENTION

Conventional methods for manufacturing surface mount components, or for manufacturing circuit supporting substrates for surface mount components, typically include methods for placing conductive preforms, e.g., solder balls, solder spheres, and preformed solder bumps, on electronic pads arranged in a predetermined placement pattern that is sometimes called a ball grid array (BGA).

A known method for placing solder bumps on electronic pads on a substrate utilizes a stencil placed over the electronic pads on the substrate to guide solder paste to flow through openings in the stencil plate onto the electronic pads. The solder paste is typically spread over the stencil using a squeegee to remove the excess solder paste. After the stencil is removed from the substrate, solder bumps are formed on, and remain attached to, the electronic pads. This method technically forms the solder bumps on the electronic pads and does not place solder that has been preformed on the electronic pads.

The solder paste, as formed in this method, has a tendency to develop internal structural defects, such as voids, or variation of fused solder volumes during the fusing process, thereby introducing potential defects to the manufacturing process and/or risk of failure during the life of the product. This is an undesirable consequence of this method.

A first known method for placing solder balls on electronic pads on a substrate utilizes a stencil plate placed over the electronic pads on the substrate to guide solder balls to drop through openings in the stencil plate onto the electronic pads. The electronic pads having been pre-printed with solder paste, the solder balls then adhere to the electronic pads via the solder paste. During a reflow operation, the solder balls fuse to the electronic pads on the substrate.

Besides requiring a guiding force to reliably introduce the solder balls into the openings in the stencil plate, this method additionally suffers from a hot-air knife reflow heating step that unevenly distributes heat over the solder balls in the stencil plate. Further, the heating step applied while the solder balls are in the stencil may cause the solder to melt and adhere to the stencil. Furthermore, a heating-knife motion control mechanism can be expensive.

A second known method for placing solder balls on electronic pads on a substrate utilizes tubes to hold the solder balls over the electronic pads. Each tube applies a vacuum force to hold a solder ball to the end of the tube. After locating the tubes holding the solder balls over the electronic pads, the solder balls are placed on the electronic pads by removing the vacuum force from the tubes and vertically vibrating the tubes to release the solder balls onto the electronic pads.

The apparatus for this second method tends to be complicated and can be expensive to produce and maintain. Since the solder balls are placed sequentially, the process is not conducive to cycle time. It also may not be suitable for micro-BGA placement where the pitch of the pads is very fine and requires tight tolerances in locating the solder spheres.

A third known method for placing solder balls on electronic pads on a substrate utilizes a plate with solder bumps attached to the plate in a pattern corresponding to the pattern of the electronic pads on the substrate. The solder bumps are attached to the plate by etching a pattern of openings in a photoresist mask over the plate according to a predefined artwork, and then depositing solder composition on the plate at the openings (where the plate surface is exposed) by an electroplating operation. Lastly, after removing the photoresist layer, the solder bumps remain attached to plate. The solder bumps are then placed on the electronic pads on the substrate by positioning the plate over the electronic pads to allow the solder bumps to contact the electronic pads. By heating the entire assembly, the solder bumps melt and transfer onto the electronic pads.

Besides constituting a relatively expensive process to implement in a mass production environment or use for occasional rework, this method requires trained operators to perform numerous steps, including chemical processing steps that can subject an operator to environmental hazards. The overall process, therefore, can be environmentally unfriendly, time consuming, expensive, and generally requiring trained operators to be effective.

Foils can be of various materials, including stainless steel, Brass, Nickel, and the like. The means of colorizing a foil can be respective to the particular material, and accomplished by inquiring to one skilled in the art.

One known method for processing metals is used by the automotive industry with one example taught by Gay, et al (U.S. Pat. No. 4,764,260, dated Aug. 16, 1988) "Process for Electroplating Nickel Over Stainless Steel", where Gay teaches a method of plating nickel to stainless steel. Gay additionally teaches the ability to use conventional plating methods onto the base Nickel surface omre specifically Chrome. Gay further mentions, whereby once the nickel is plated onto the stainless steel, other conventional plating processes may be used to apply other materials. Once plated with nickel, the foil can then be plated in a zinc bath, and lastly subject the plate to a black chromate bath.

A second known method of colorizing metal is to apply tool maker's die such as red tool makers dye.

A plurality of pins for use as a releasing and/or placing mechanism was disclosed in the parent application, Ser. No. 08/789,883, dated Jan. 28, 1997.

The use of Ball Grid Array technology is increasing as the advantages of the interconnect process are recognized. The disadvantage of this technology is where rework or salvage of components using Ball Grid Array technology is required; once the component is removed a portion of the solder preforms remains on the component and a portion of the solder preforms remains on the Printed Circuit Board (PCB). Thus, what is necessary is a low cost and efficient method and apparatus for placing conductive preforms on pads on a component, or on a substrate.

SUMMARY OF THE INVENTION

One aspect of the present invention is to provide a low cost tool for locating and placing the conductive preforms onto the pads of substrates or components. The tool preferably comprises a foil structure that includes a plurality of openings that are used to locate, hold, and place the conductive preforms onto the pads.

Another aspect of the present invention is the use of current state of the art technology, including artwork and a photodeveloping and etching process on the foil to create the openings. This process eliminates significant variation in locating and forming the openings in the foil while maintaining a low cost for the tool. As the distance between the centers of the pads (pitch) decreases, such as for fine pitch, or micro BGA (PBGA) manufacturing, the variation in locating and shaping the openings becomes significantly more critical for maintaining an accurate and reliable conductive preform placement process.

Another aspect of the present invention is the ability to facilitate changing a pattern of openings on a foil for placing conductive preforms on different arrangements (patterns) of pads. By using different foils with different etched patterns (different patterns of openings etched in the foils), the low cost tool can efficiently place conductive preforms on different patterns of pads on a substrate.

Another aspect of the present invention is the ability to utilize one aperture pattern and modify the placed pattern of preforms by filling or covering the undesirable apertures. The material partially covering the first foil aperture can increase the reliability of filler material located inside the undesired apertures of the foil.

Another aspect of the present invention is the ability to include a mechanism to hold the conductive preforms at the openings in the foil and then remove the holding force to place the conductive preforms on the pads.

Another aspect of the present invention is the ability to allow flow of a vacuum force to the apertures of the foil.

Another aspect of the present invention is the ability to utilize apertures which are used to locate the conductive preforms, in conjunction with a second feature which retains the preform from entering the vacuum chamber. This aspect ensures release of the conductive preforms. The feature which controls the distance which the preforms enter into the vacuum chamber can be, but not limited to a fabric mesh, a screen, a second foil of either metal, mylar, Polyimide, or any other known material with smaller apertures, or any porous material.

Another aspect of the present invention is the ability to create a difference in the size of the apertures on each side of the foil (a taper in the cross section of the openings of the foil) to attain a better process for accounting for tolerances, securing, and releasing the conductive preforms. The degree of taper can preferably be varied by modifying the artwork for the two opposing sides of the foil.

DETAILED DESCRIPTION OF THE INVENTION

Figure 1:
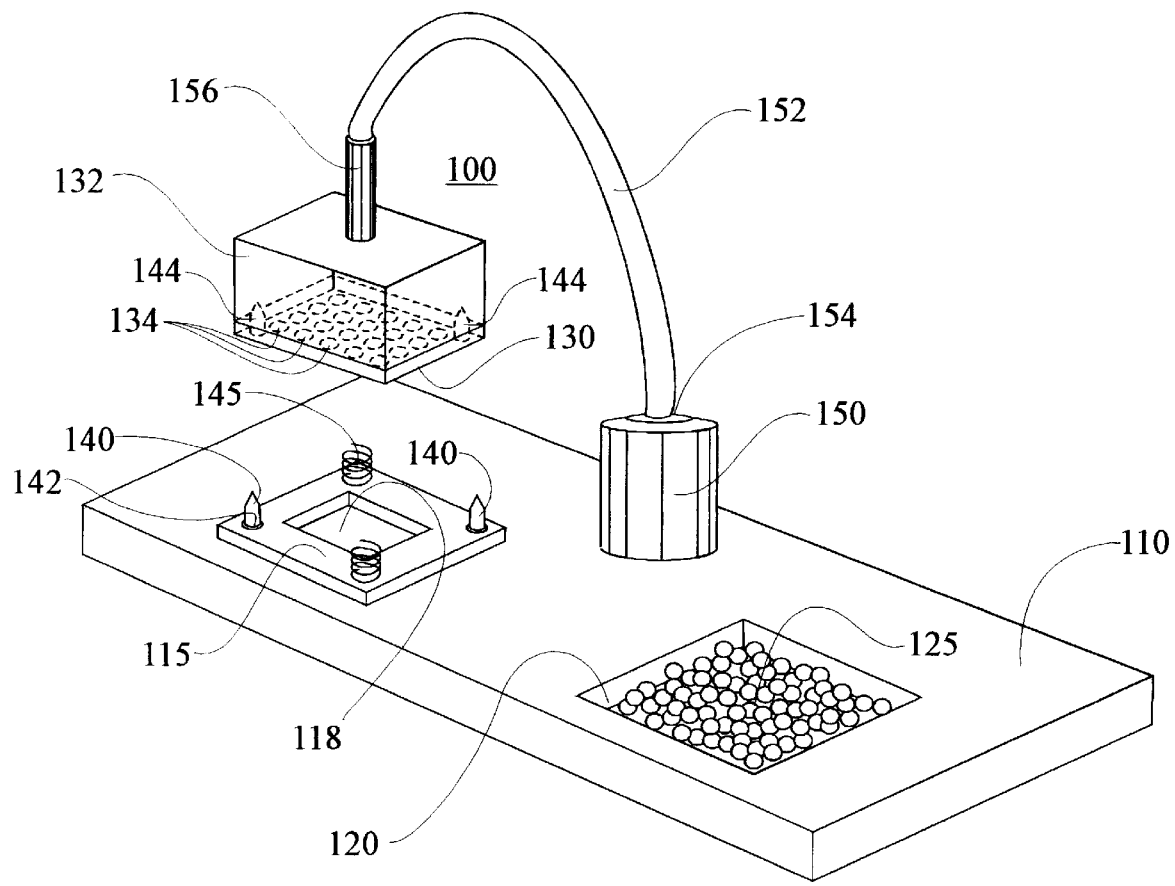
FIG. 1 is an isometric view of a Ball Grid Array Applicator apparatus, according to a preferred embodiment of the present invention.

FIG. 1 illustrates an isometric view of a Ball Grid Array (BGA) applicator 100 in accordance with a preferred embodiment of the present invention. A platform 110 supports an alignment plate 115 and a reservoir 120 to contain said conductive preforms 125.

In a preferred manual configuration, the placement apparatus 132 is aligned to the component (not shown) by placing the component into the cavity 118 in the component alignment plate 115. The component alignment plate is registered to the placement apparatus 132 by use of alignment pins 140 through alignment holes 142 in the component alignment plate 115 and the placement apparatus alignment holes 144 in the placement apparatus 132. Optionally release springs 144 may be included to assist with separating the placement apparatus from the component. The alignment pins 142 can be optionally used for alignment of the stencil (not shown) for applying a pattern of tacking media, such as epoxy, flux, solder paste, or similar (not shown) to correspond to the pattern 134 of the placement foil 130 of the placement block structure 132.

In an automatic configuration, an automated equipment, or a robotic arm and end-effector, (not shown) could constitute the movable placement apparatus 120 that automatically moves along the axis substantially perpendicular to the alignment plate 115 according to a predetermined operational sequence, such as a programmed set of instructions at a robotic station (not shown).

A foil 130 with a pattern 134 is coupled to a block structure 132 according to a construction and arrangement that will be fully discussed below.

In a preferred configuration of the BGA applicator 100, two aligning pins 140 are affixed on, and perpendicular to, the platform 110 to cooperatively mate with alignment apertures 142 in the alignment plate 115, and alignment apertures 144 in the block structure 132. The aligning pins 140 mate with the alignment apertures 144 to provide a reliable alignment mechanism for the block structure 132 and the component alignment plate 115, thus reliably aligning the placement pattern 134 to the desired location on the component (not shown). Additionally, the block structure 132 and the alignment plate 115 can be interchanged with others of different patterns, insuring repeatable alignment.

In one embodiment, a vacuum source 150 is coupled to a port (not shown) in the block structure 132, such as via a flexible hose 152 and connectors 154, 156. The vacuum source 150, when activated, delivers a first vacuum force to the port in the block structure 132. When deactivated, the vacuum source 150 then delivers a second (zero) vacuum force to the port in the block structure 132. In this way, a vacuum force can be applied to the port in the block structure 132 for a placement operational sequence using the placement pattern 134 in the foil 130 and block structure 132, as will be more fully discussed below.

Figure 2:
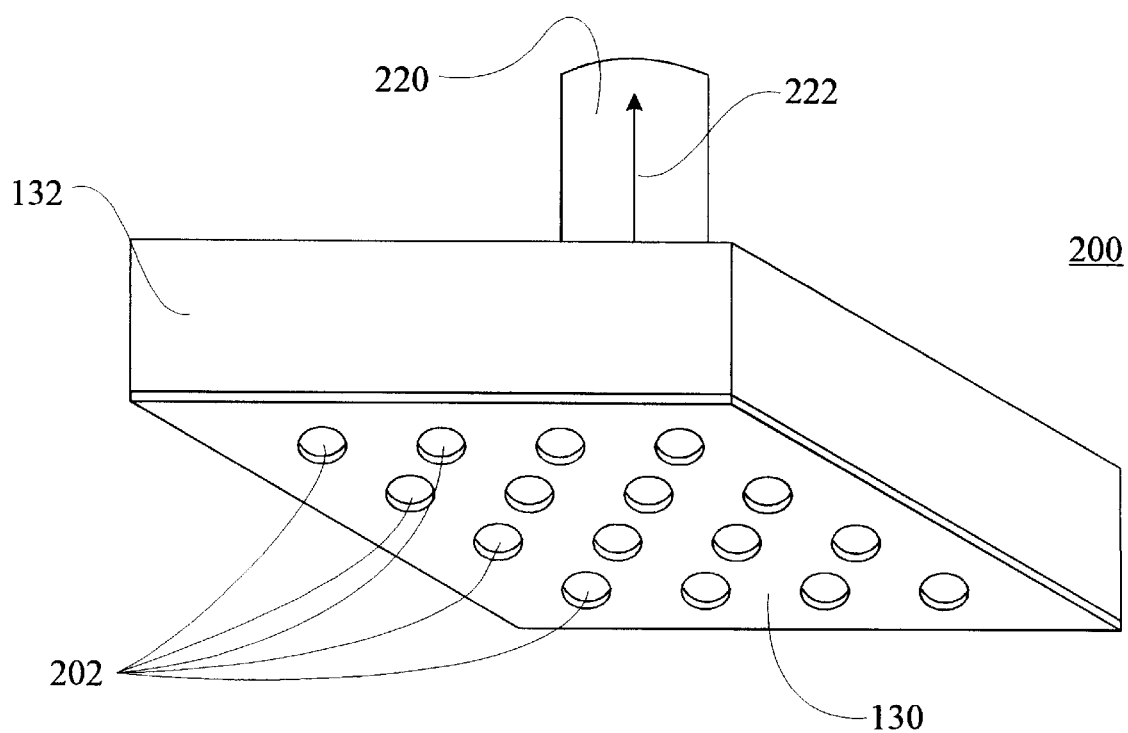
FIG. 2 is an isometric view of a foil and block structure representing a portion of a conductive preform placement apparatus, according to a preferred embodiment of the present invention.

Referring to FIG. 2, according to a preferred embodiment of the present invention, a foil 130 is coupled to a block structure 132. The foil 130 has a pattern of openings 202 created therein to match a pattern of pads (not shown) located on a substrate (not shown), such as to match a pattern of electronic pads on a component or on a circuit supporting substrate. Preferably, the pattern of openings 202 is created using an etching process with a predefined artwork for accurately locating and shaping the openings, as will be more fully discussed below.

The block structure 132 includes a main vacuum port 220 of the block structure 132 and pneumatically coupled to an external vacuum source 150 (see FIG. 1). A vacuum force 222 is provided through the vacuum port 220 and thereby routed through an expansion area (not shown) to the pattern of openings 202 in the foil 130. It can be recognized that the optimal vacuum flow 222 to the pattern of apertures 202, where the design limits the minimal cross section for any point of the vacuum routing system to be greater than the sum of the area of the maximum number of apertures. The completed block assembly is illustrated as 200.

Figure 3:
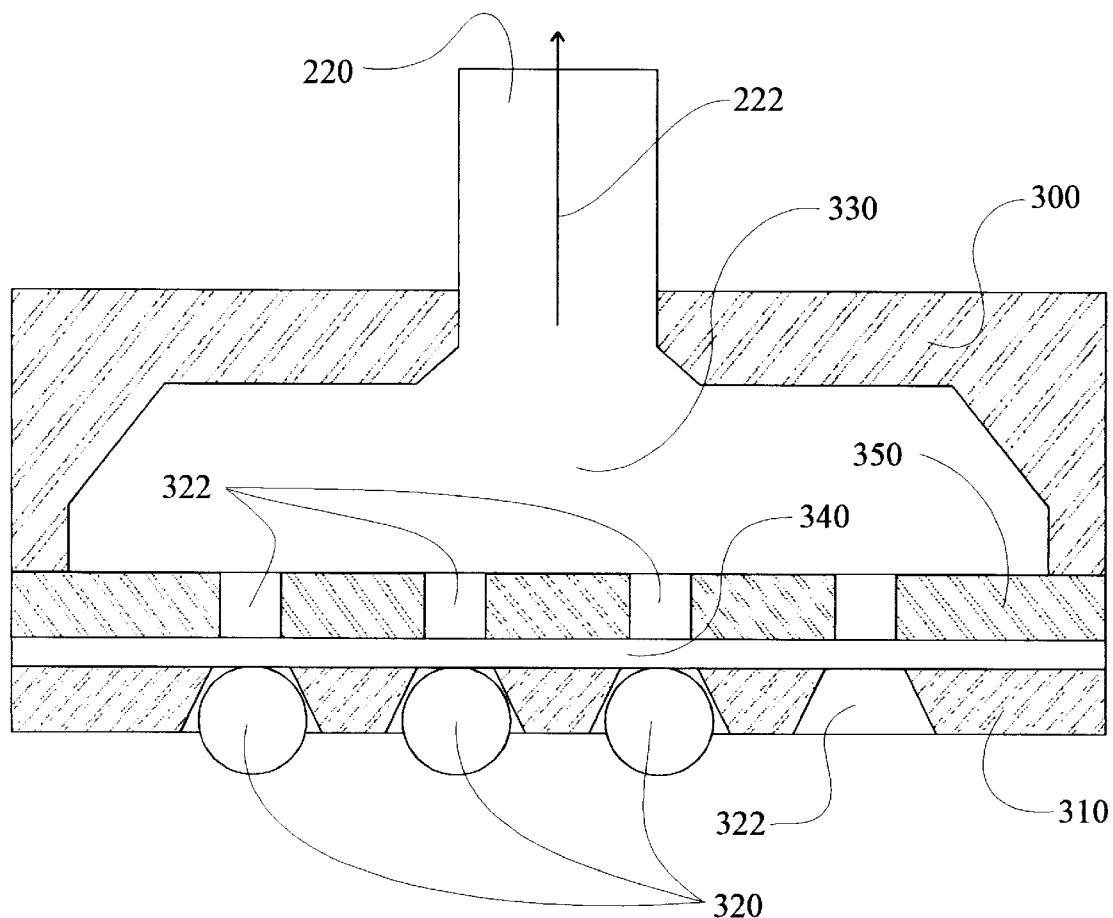
FIG. 3 is a cross sectional view of the foil and block structure of FIG. 2, additionally showing solder spheres being held at openings in the foil and the flow through backing media.

FIG. 3 is a cross-sectional view of the block structure 300 and first foil 310 shown respectively within the apparatus as 132, 130 of FIG. 1, illustrating solder spheres 320 positioned in openings 322 in the first foil 310 respectively representing the pattern 202 in the foil 130 (see FIG. 2). The solder spheres 320 are arranged in the apertures 322 (shown with an optional trapezoidally shaped cross sectional) of the foil 310. A vacuum force 222 is provided to the vacuum port 220 and thereby routed through a vacuum expansion area 330 to the pattern of openings 322 in the foil 310. The force of a vacuum to locate and hold the solder spheres into a foil is capable of mechanically coupling the solder sphere 320 within the aperture 322 of the foil 310 impeding complete release of the solder spheres. This scenario can be avoided by including a solder sphere backing material 340 located between the vacuum expansion area 330 and the foil 310 where the material 340 is used to control the distance which the solder spheres 320 can penetrate into the vacuum expansion area 340. The preferred embodiment of the invention describes using a mesh fabric material for the solder sphere backing material, while it can be recognized that any porous material 340 where at least a portion of the material 340 covers a portion of the aperture 322 in the foil 320. The solder backing material 340 allows for a cross sectional dimension of the apertures 322 to be larger than the cross sectional dimensions of the solder spheres 320. The backing material 340 must be assembled in a manner where the backing material 340 does not significantly deflect from the foil 310 when exposed to the force of the solder spheres as created by the flow of the vacuum system. The backing material 340 can be made of a stiff material, bonded directly to the surface of the foil 320 or supported by including a second foil 350, similar to 310. This feature provides for release of the solder spheres 320 from the apertures 322 of the foil 310 without use of any additional forces, resulting in a very simple, repeatable, and low cost apparatus and method.

An alternative assembly to obtain the same feature for release of the solder spheres would be to reduce the apertures of the second foil 350 to control the distance where the solder spheres 320 penetrate into the vacuum expansion area 330.

Figure 4:
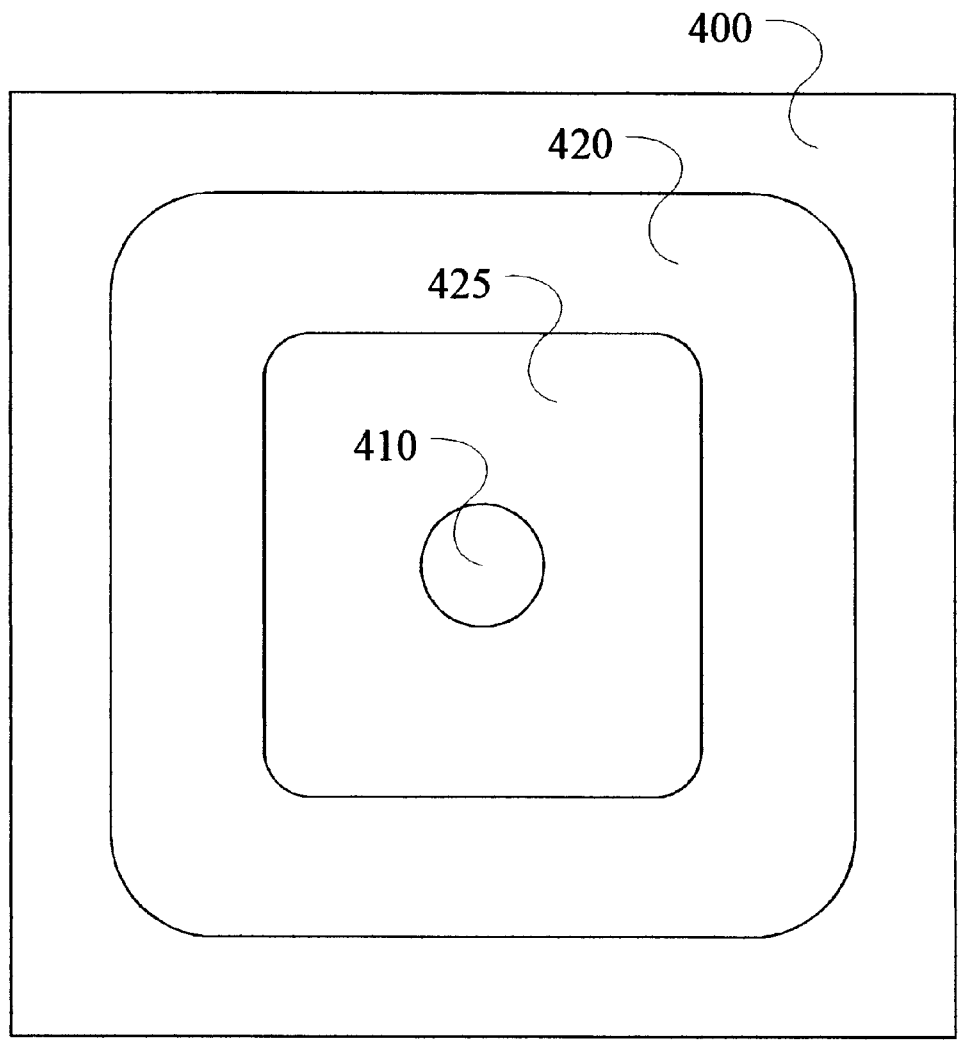
FIG. 4 is a bottom side plan view of a block structure constructed in accordance with a preferred embodiment of the present invention.

FIG. 4 is a bottom side plan view of a block structure constructed in accordance with a preferred embodiment of the present invention. The bottom side plan view of the block structure illustrates the outline of the block structure 400, the vacuum chamber 410, bottom of the vacuum expansion area 420, and top of the vacuum expansion area 425.

FIGS. 5, 6, 7 and 8 are cross-sectional side views of a foil and represent steps in making the foil according to a preferred embodiment of the present invention. Although the steps represented by FIGS. 5, 6, 7, and 8 describe a preferred embodiment of the present invention, one can recognize that other processes such as laser drilling or material buildup or other methods can be alternatively used to create the foil.

Figure 5:
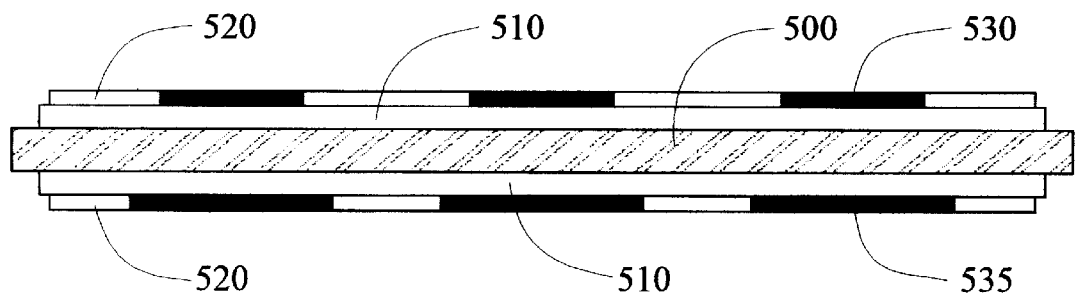
FIGS. 5, 6, 7 and 8 are cross-sectional side views of a foil and represent steps in making the foil according to a preferred embodiment of the present invention.

FIG. 5 illustrates the raw material for the foil 500 in pre-etched state. The raw material for the foil 500 may consist of, but is not limited to stainless steel, brass, polyimide, mylar, copper, nickel, etc. Phototooling 510 is laminated to both sides of the raw material for the foil 500. Phototooling 510 can be described as a chemical or material that changes state (develops) when exposed to a light source. The artwork 520 is placed on both sides of the foil above the phototool 510. The artwork 520 blocks the light from the phototooling resulting in the transfer of the desired pattern. The phototooling 510 which is exposed to light is cured and the phototooling 510 which is not exposed to light is not cured and later removed, resulting in a negative of the pattern on the foil. The pattern 530 on one side of the foil may purposely be of a different size compared to the pattern 535 on the opposing side.

Figure 6:
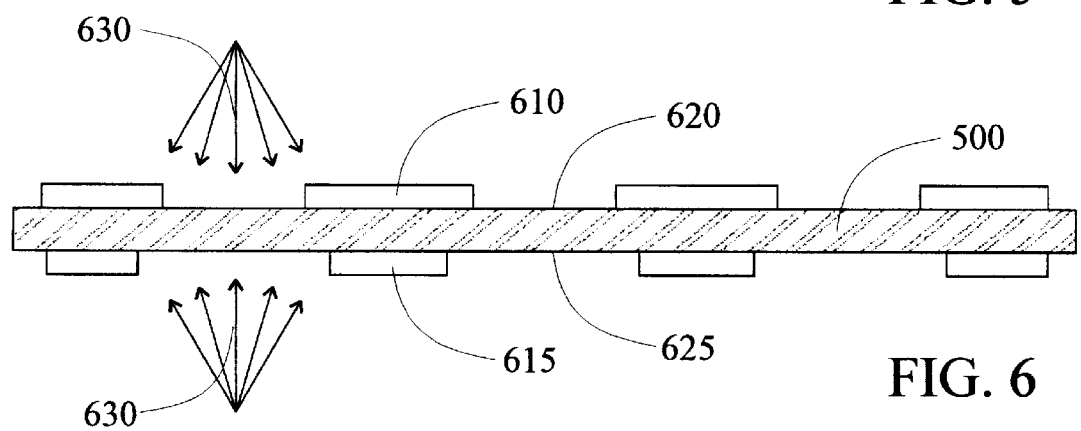

FIG. 6 illustrates the raw material of the foil 500 prepared to be chemically etched. The raw material of the foil 500 has the exposed phototooling 610, 615 after the artwork 520 (not shown) has been removed, a pattern 620 on one side, and a pattern of optionally different size 625 on the opposing side. The raw material of the foil 500 with the laminated, developed phototooling 610, 615 is subjected as an assembly to a chemical 630 with properties which remove the raw material of the foil 500 not coated with developed phototooling 620 and 625.

Figure 7:
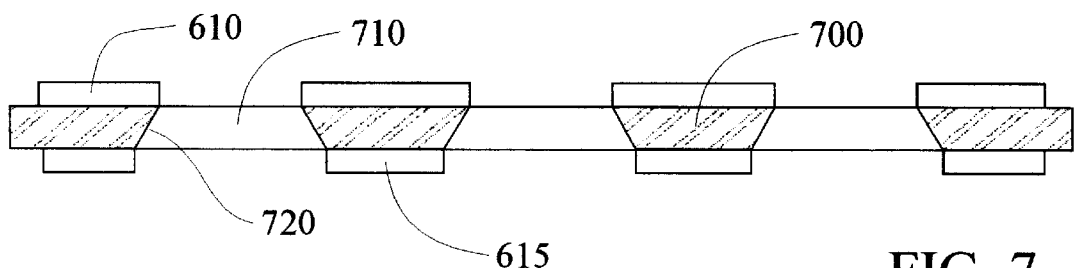

FIG. 7 illustrates a cross section of the foil 700 in a post etch state. The removed material creates an aperture 710. The resultant optional trapezoidal cross section 720 is illustrated as created by utilizing the optionally different sized patterns 610 and 615 on opposing sides of the foil 700.

Figure 8:
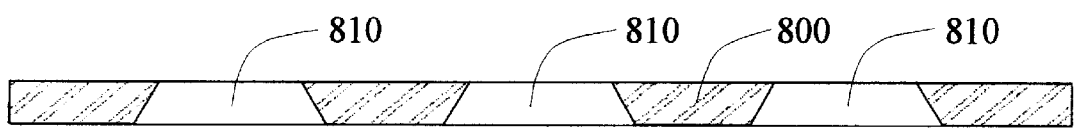

FIG. 8 illustrates a cross section of the foil 800 in a post etch state with the phototooling removed. The pattern 810 can optionally be enhanced by additional post etch processing including but not limited to plating alternative materials such as Teflon, copper, silver, nickel, or gold to the etched foil or electropolishing the etched foil.

Figure 9:
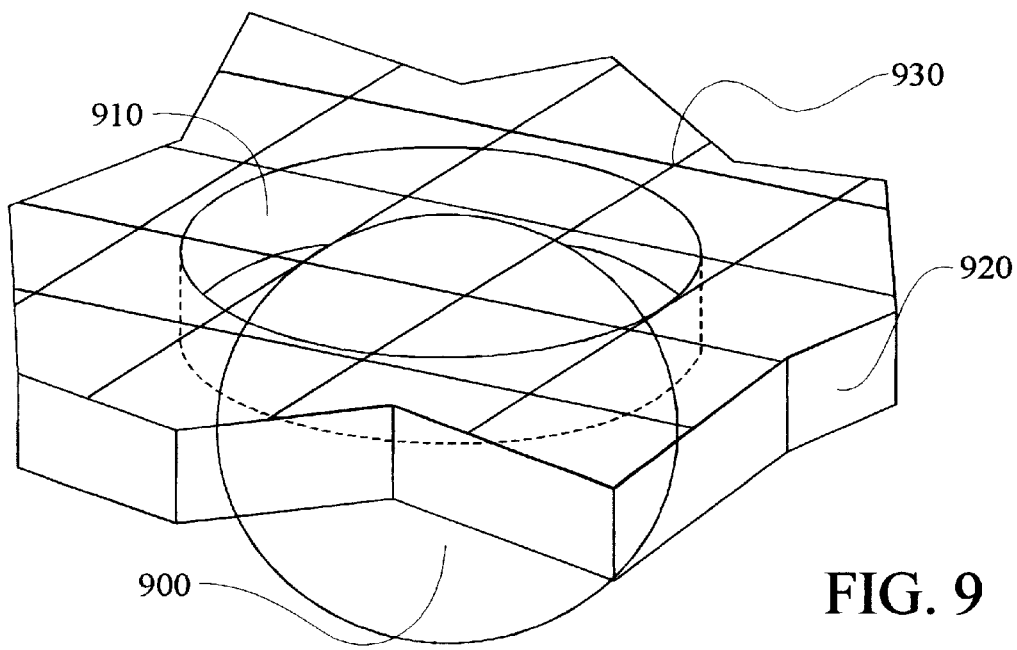
FIG. 9 is an isometric view of a foil illustrating the relation of a sample porous material, an aperture and a solder sphere according to the preferred embodiment of the present invention.

FIG. 9 is an isometric view illustrating how the flow of the vacuum (not shown) holds a solder sphere 900 against the screen mesh 930 and contained within the aperture 910 created in the foil 920. It can be taught that the use of any material which partially covers the aperture to hold the sphere from entering into the vacuum cavity can be used.

Figure 10:
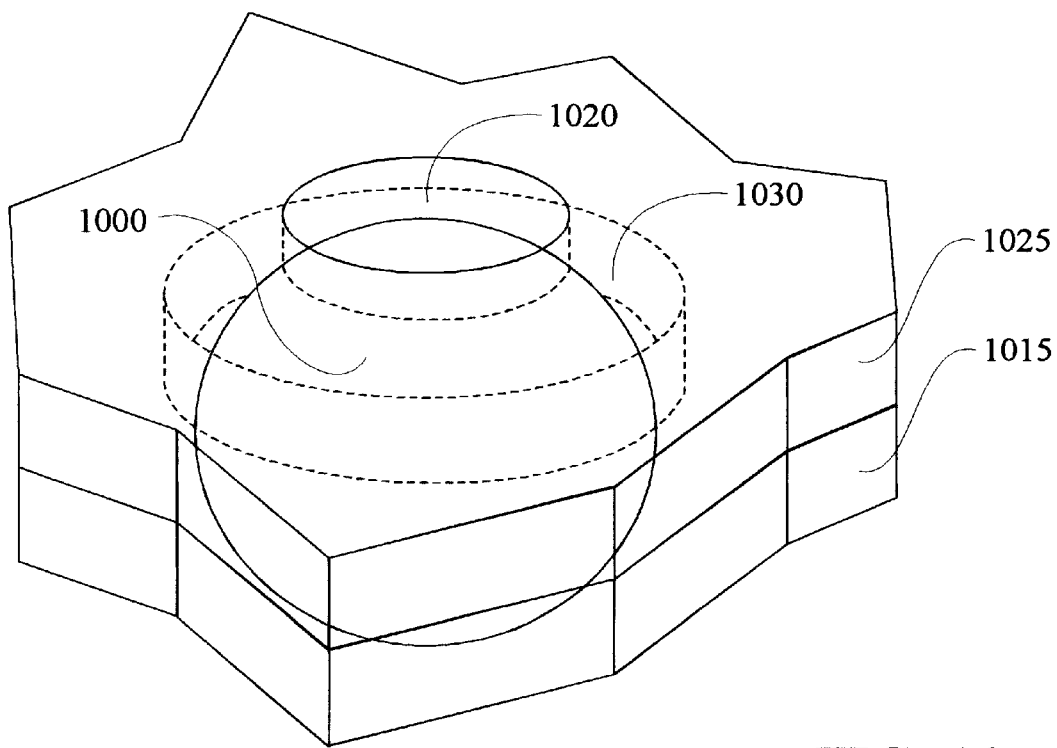
FIG. 10 is an isometric view of multiple foils illustrating the relation of the first locating foil with a pattern aperture and a second backing foil with a smaller backing aperture and a solder sphere according to an alternate embodiment of the present invention.

FIG. 10 is an isometric view demonstrating an alternative embodiment of the invention, illustrating how the flow of the vacuum (not shown) through a vacuum aperture 1020 in a second foil 1025 holds a solder sphere 1000 against an area 1030 of a second foil 1025 overlapping an area of a containing aperture 1010 and contained within the containing aperture 1010 created in a first foil 1015.

Figure 11:
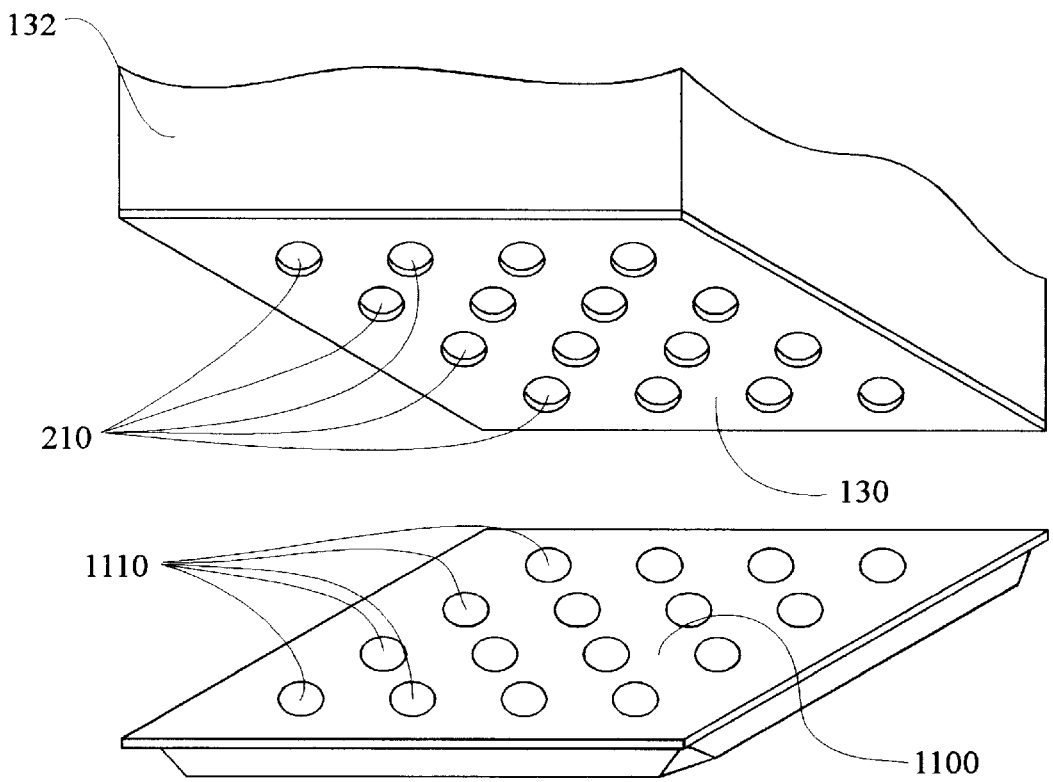
FIG. 11 is an isometric view of a foil located in proximity with a component.

FIG. 11 illustrates a foil 130 coupled to a block structure 132 located in proximity with a component 900. The pattern of openings 210 in the foil 130 is created to match a pattern of pads 910 located on the component 1100. Preferably, the pattern of openings 1110 is created using predefined artwork and a photodeveloping and a chemical etching process.

Figure 12:
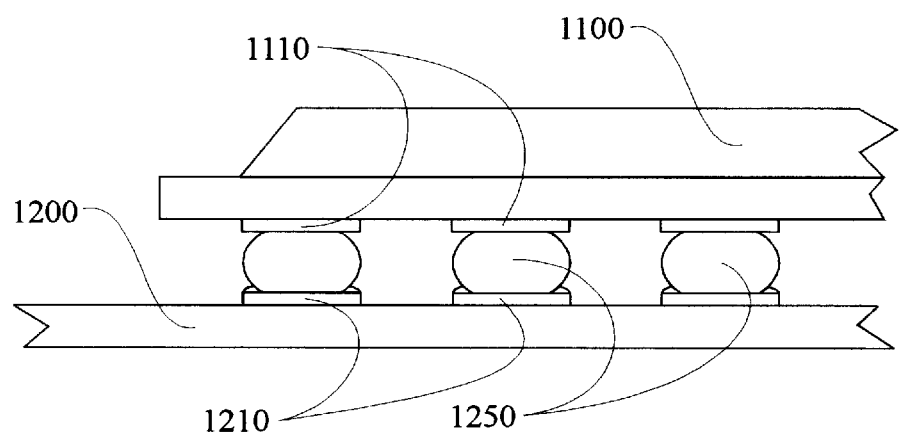
FIG. 12 is a cross-sectional side view of a component installed on a circuit supporting substrate.

FIG. 12 is a view of the component 1100 and a corresponding receiving circuit supporting substrate 1200. The pads 1110 on the component 1100 are typically prebumped with conductive preforms, such as with solder balls 1250. When the component 1100 is placed on the circuit supporting substrate 1200, the solder balls 1250 electrically and mechanically couple the pads 1110 on the component 1100 and the pads 1210 on the circuit supporting substrate 1200.

Figure 13:
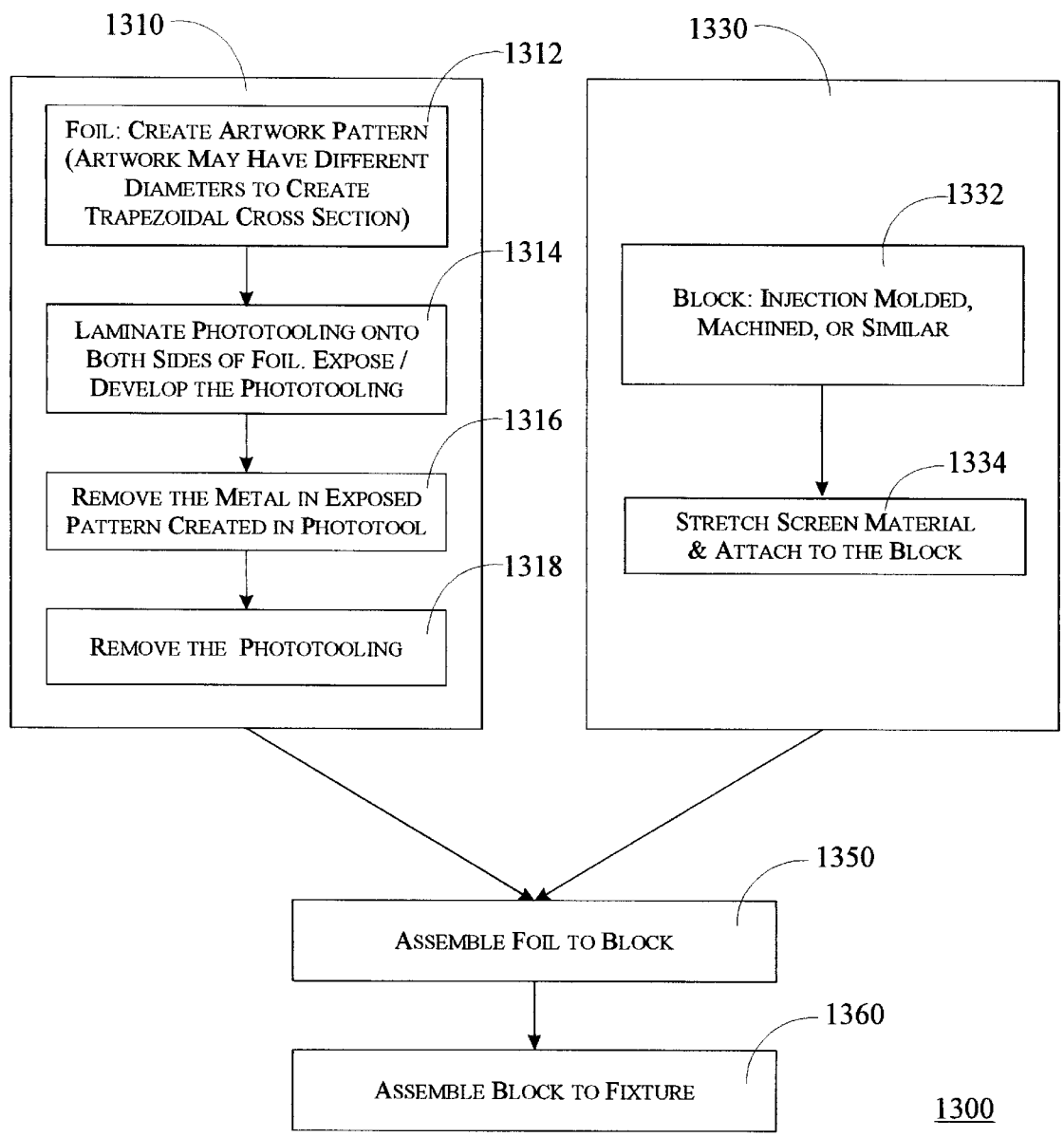
FIG. 13 is a flow diagram for a manufacturing process for a ball grid array applicator, according to a preferred embodiment of the present invention.

FIG. 13 is a flow diagram 1300 illustrating a preferred manufacturing process for the foil 130 and the block structure 132 of the BGA applicator 100, according to a preferred embodiment of the present invention. The manufacturing process describes a method 1310 for tooling the foil 130 and a method 1330 for tooling the block 132. Numerous methods to create apertures within a foil are well known, with the most common described in the process flow 1310. The first step 1312 to create the foil 130 is to create artwork with the required pattern. Two artworks 520 are required, one for each side of the foil 130. The artwork 520 can optionally be created such that the diameter of each circle of the pattern on the first artwork 530 is different from the corresponding circles of the pattern on the second artwork 535. This difference results in a trapezoidal cross section 720 when the foil is etched. The second step 1314 to create the foil 130 is to laminate the phototooling 520 onto both sides of the raw material of the foil 500, develop the phototooling 520, and remove the non-developed portion of the phototooling leaving exposed metal 620 and 625. Once completed the phototooling creates a negative of the pattern on the raw material of the foil 500. The third step 1316 to create the foil 130 is to remove the exposed metal 620 and 625 by a chemically etching process. The forth and final step 1118 to create the foil 130 is to remove the phototooling 610, 615. The first step 1332 to create the block structure 132 is to form the block by either molding, machining or similar. The second step 1334 to create the block structure 132 is to stretch screen material 340 and attach the screen material 340 to the block 132. Alternatively, the screen material 340 can be adhered to the foil 130. Upon completion of the foil 130 and the block structure 132, the next step 1350 is to couple the two assemblies together to complete the apparatus 200. The final step 1360 would be to install the apparatus 200 onto the vacuum source 150 via a flexible hose 152 and connectors 154, 156.

Figure 14:
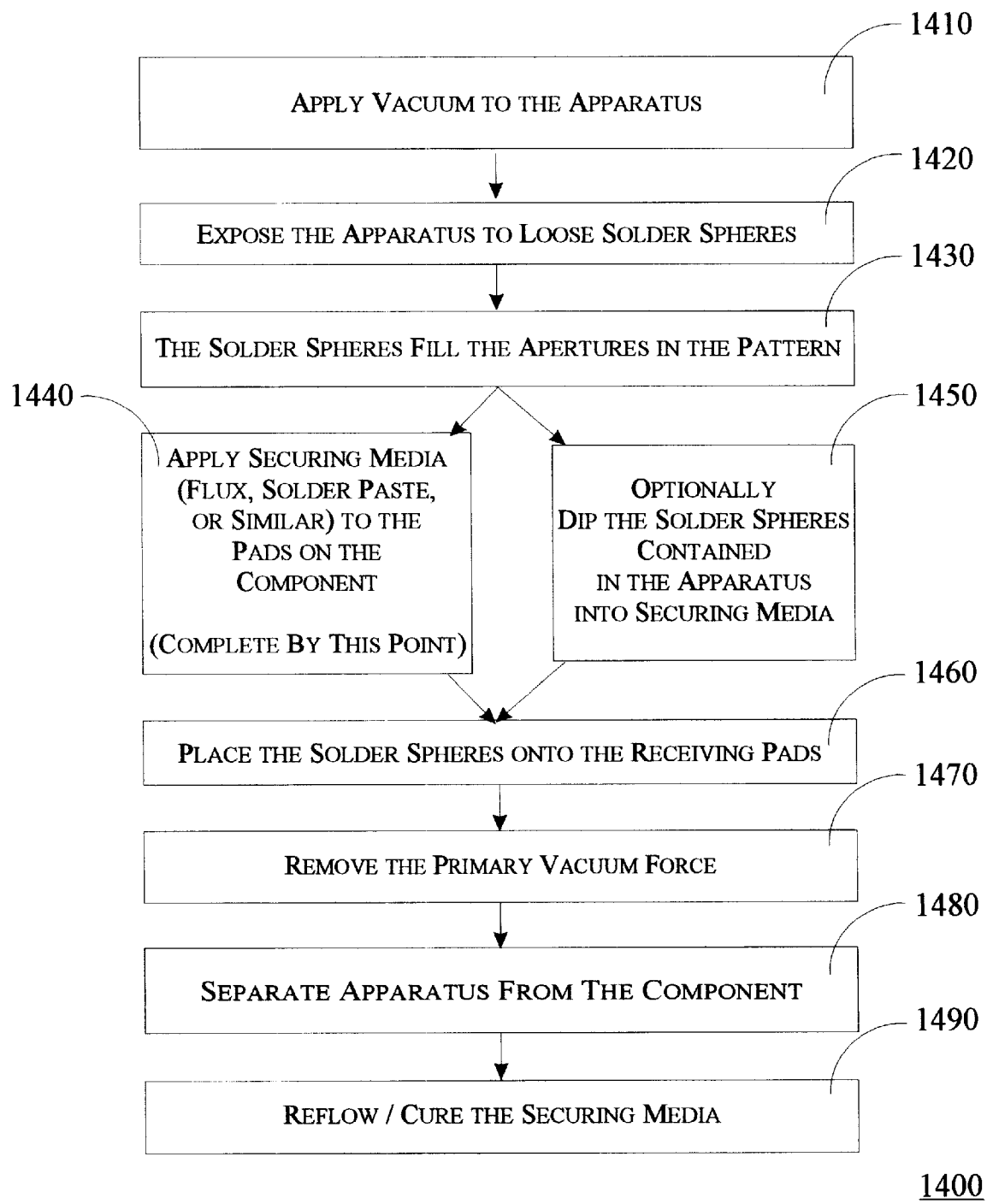
FIG. 14 is an operational flow diagram illustrating a method, according to a preferred embodiment, for using the ball grid array applicator to place solder balls onto pads.

FIG. 14 is an operational flow diagram 1400 demonstrating the method of applying the conductive preforms to a pattern of pads 1110 or 1210. The first step 1410 to applying the solder spheres 320 is to create a vacuum 222 within the vacuum chamber 220 and the vacuum expansion chamber 330. The second step 1420 is to expose the apparatus 200 to a reservoir 120 of loose conductive preforms 125, where the preferred embodiment would be solder spheres 320. The third step 1430 results from the second step 1450 where the flow from the vacuum will lift the loose solder spheres 320 and hold one sphere per aperture 322 of the pattern 202. The forth step 1440, 1450 is to apply a media which is used to temporarily secure the solder spheres 320 to either the pads 1110 on the component 1100 or the pads 1210 on the receiving substrate 1200. One method 1440 which can be used would be to apply a media (flux, solder paste, conductive epoxy, etc.) directly to the receiving pads by dispensing, screen printing or other well known processes. A screen printing process can utilize the alignment pins 140 by including alignment apertures similar to 142 of the alignment plate 115 on a flux/solder paste printing foil (not shown). An alternative method 1450 which can be used is to dip the solder spheres 320 into a trough with a predetermined thickness of the media. The fifth step 1460 to applying the solder spheres 320 is to place the solder spheres onto the receiving pads 1110 or 1210. Aligning pins 140 and the component alignment plate 115 can be used to assist in properly aligning solder spheres 320 to the pads 1110 on the component 1100 or pads 1210 on the substrate 1200. The sixth step 1470 to applying the solder spheres 320 to the receiving pads 1110 or 1210 is to release the solder spheres 320 from the apparatus 200 by applying a zero vacuum force 222 and/or using the tact of the securing media. The seventh step 1480 to applying the solder spheres 320 to the receiving pads 1110 or 1210 is to separate the apparatus 200 from the component 1100 or the substrate 1200, leaving the conductive preforms within the securing media. The ninth step 1490 in the process is to optionally remove the component from the apparatus and bond the solder spheres 320 to the receiving pads 1110 or 1210. The bonding process would be respective of the material used for the securing media. Some examples would be reflow for flux or solder paste or curing for conductive epoxy.

In a preferred embodiment of the present invention, the surface of the placement foil is treated to change the color of the foil to improve the contrast between the conductive preforms and the foil. A different color of the surface of the foil to contrast the color of the conductive preforms is useful in a placement operation, such as for holding a plurality of conductive preforms to a plurality of openings in the placement foil and for placing the plurality of conductive preforms on a plurality of electronic pads.

What is claimed is:

1. A method for placing a plurality of conductive preforms on a plurality of electronic pads, the method comprising the steps of:

placing a plurality of conductive preforms with relation to a plurality of openings in at least one foil whereby the surface of the foil is treated to differ in color from the conductive preforms, holding a plurality of conductive preforms to a plurality of openings in the at least one foil by providing at least one holding force to the plurality of conductive preforms against a secondary material which covers at least a portion of the openings of the foil;

applying a tacky media to at least one of the plurality of conductive preforms and the plurality of electronic pads;

inspecting the plurality of conductive preforms whereby the inspection step is assisted by the color of the foil;

locating the plurality of conductive preforms at a plurality of electronic pads; and placing the plurality of conductive preforms on the plurality of electronic pads.

2. The method of claim 1, wherein the placing step comprises the steps of:

applying placing force to the plurality of conductive preforms in the direction of the plurality of electronic pads.

3. An apparatus for placing a plurality of conductive preforms on a plurality of electronic pads, the apparatus comprising:

at least one foil including a plurality of openings, whereby the surface of at least one foil is treated to provide color to assist in the inspection of the plurality of conductive preforms;

a secondary material located proximate the at least one foil, whereby the second material covers at least a portion of the opeings of the foil therein for holding a plurality of conductive preforms to the plurality of openings against the secondary material by a holding force; and a means for placing the plurality of conductive preforms on a plurality of electronic pads.

4. The apparatus of claim 3, wherein the foil is manufactured from one of the following materials:

(a) Stainless Steel;

(b) Brass;

(c) Nickel;

(d) Polyimide; and (e) a thin strong polyester film.

5. The apparatus of claim 3, wherein the plurality of openings in the foil are constructed using at least one of the following production processes:

(a) chemically etching the foil utilizing predefined artwork masking for the pattern of the plurality of openings;

(b) laser drilling the foil utilizing a predefined pattern for drilling the plurality of openings; and (c) mechanically drilling the foil utilizing a predefined pattern for drilling the plurality of openings.

6. The apparatus of claim 3, wherein the secondary material consists of one of the following materials:

(a) Woven fabric;

(b) Polyester mesh;

(c) Silk screen;

(d) Metal screening; and (e) A sponge material.

7. The apparatus of claim 3, wherein the secondary material is at least partially adhered to the foil.

8. The apparatus of claim 3, wherein the secondary material is contained between two foils.

9. The apparatus of claim 3, wherein the secondary material is a second foil wherein, the apertures are smaller in size compared to the apertures of the first foil.

10. The apparatus of claim 3 where the dimensions of the aperture on one side of the foil differ from the dimensions of the aperture on the opposing side of the aperture.

11. An apparatus for placing a plurality of conductive preforms on a plurality of electronic pads, the apparatus comprising:

at least one foil including a plurality of openings, whereby the surface of at least one foil is treated to provide color to the surface to assist in the inspection of the plurality of conductive preforms;

a secondary material which covers at least a portion of the openings of the foil therein for holding a plurality of conductive preforms to the plurality of openings against the secondary material by a vacuum holding force applied to the plurality of conductive preforms through the plurality of openings and for placing the plurality of conductive preforms on a plurality of electronic pads; and a block structure including a chamber for applying at least one vacuum force to the foil.

12. The apparatus of claim 11, wherein the apparatus further includes:

at least one aligning pins located on a workplate; and at least one aligning hole in at least one of the block structure and the at least one foil corresponding to the at least one aligning pin for alignment.

13. The apparatus of claim 12, the apparatus further comprising an aligning plate wherein the alignment plate comprises at least one aligning hole and at least one of at least one aperture and at least one cavity for a component.

14. The apparatus of claim 11, wherein the plurality of openings in the foil are constructed using at least one of the following production processes:

(a) chemically etching the foil utilizing predefined artwork masking for pattern of the plurality of openings;

(b) laser drilling the foil utilizing a predefined pattern for drilling the plurality of openings; and (c) mechanically drilling the foil utilizing a predefined pattern for drilling the plurality of openings.

15. The apparatus of claim 11, wherein the secondary material consists of one of the following materials:

(a) Woven fabric;

(b) Polyester mesh;

(c) Silk screen;

(d) Metal screening; and (e) Mylar.

16. The apparatus of claim 11, wherein the secondary material is contained between two foils.

17. The apparatus of claim 11, wherein the secondary material is a second foil wherein, the apertures are smaller in diameter compared to the apertures of the first foil.

18. The apparatus of claim 11 where the dimensions of the aperture on one side of the foil differ from the dimensions of the aperture on the opposing side of the aperture.

19. An apparatus for placing a plurality of conductive preforms on a plurality of electronic pads, the apparatus comprising:

a foil including a plurality of openings therein for placing a plurality of conductive performs on a plurality of electronic pads whereby the surface of the foil is treated to provide color to the surface of the foil for assisting in inspection of the plurality of conductive preforms.

20. The apparatus of claim 19, wherein the apparatus further comprises:

a means for applying a removable holding force to the plurality of conductive preforms.

21. The apparatus of claim 3, whereby the means for placing the conductive preforms on the plurality of electronic pads is a plurality of pins.

22. The apparatus of claim 9, whereby the second foil is manufactured from one of the following materials:

(a) Stainless Steel (b) Brass (c) Nickel (d) Polyimide (e) Mylar.

* * * * *